(12) United States Patent
Terai

(10) Patent No.: US 11,081,591 B2
(45) Date of Patent: Aug. 3, 2021

(54) SEMICONDUCTOR DEVICE AND DISPLAY UNIT

(71) Applicant: JOLED INC., Tokyo (JP)

(72) Inventor: Yasuhiro Terai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/736,814

(22) Filed: Jan. 8, 2020

(65) Prior Publication Data

US 2020/0335627 A1   Oct. 22, 2020

(30) Foreign Application Priority Data

Apr. 19, 2019 (JP) .............................. JP2019-080382

(51) Int. Cl.
| | |
|---|---|
| *H01L 29/786* | (2006.01) |
| *H01L 27/12* | (2006.01) |
| *H01L 21/02* | (2006.01) |
| *G02F 1/1362* | (2006.01) |
| *H01L 29/12* | (2006.01) |

(52) U.S. Cl.
CPC .... *H01L 29/7869* (2013.01); *G02F 1/136213* (2013.01); *H01L 21/0217* (2013.01); *H01L 21/02164* (2013.01); *H01L 21/02178* (2013.01); *H01L 27/1225* (2013.01); *H01L 27/1248* (2013.01); *H01L 27/1255* (2013.01); *H01L 29/12* (2013.01); *H01L 29/78606* (2013.01); *H01L 29/78651* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 2009/0261355 A1 | 10/2009 | Matsukizono et al. | |
| 2015/0255518 A1* | 9/2015 | Watanabe | ........... H01L 27/1255 257/40 |
| 2015/0364610 A1* | 12/2015 | Tsubuku | ........... H01L 21/02554 257/43 |

FOREIGN PATENT DOCUMENTS

WO     2007/032128 A1     3/2007

* cited by examiner

*Primary Examiner* — Bo B Jang
(74) *Attorney, Agent, or Firm* — Hauptman Ham, LLP

(57) ABSTRACT

A semiconductor device includes a substrate, a first semiconductor auxiliary film, a semiconductor film, a gate insulating film, and a gate electrode. The first semiconductor auxiliary film is provided in a selective region on the substrate. The semiconductor film includes an oxide semiconductor material, and has a low-resistive region in contact with the first semiconductor auxiliary film and a channel region provided in a portion different from the low-resistive region. The gate insulating film covers the semiconductor film from the channel region to at least part of the low-resistive region. The gate electrode is opposed to the channel region of the semiconductor film via the gate insulating film.

8 Claims, 7 Drawing Sheets

SEMICONDUCTOR DEVICE AND DISPLAY UNIT

CROSS REFERENCE TO RELATED APPLICATIONS

This application claims the benefit of Japanese Priority Patent Application No. 2019-080382 filed Apr. 19, 2019, the entire contents of which are incorporated herein by reference.

BACKGROUND

The technology relates to a semiconductor device including an oxide semiconductor material, and a display unit.

A semiconductor device including a thin film transistor has found its application in a variety of electronic apparatuses such as display units, as disclosed in International Publication No. WO 2007/032128, for example. The thin film transistor includes a semiconductor film, a gate insulating film, and a gate electrode on a substrate, for example.

SUMMARY

For a semiconductor device, it is desirable to suppress a defect from occurring due to a short circuit being occurred between a gate electrode and a semiconductor film, for example.

It is therefore desirable to provide a semiconductor device that is able to suppress a defect from occurring due to a short circuit being occurred, and a display unit including the semiconductor device.

A semiconductor device according to one example embodiment of the technology includes: a substrate; a first semiconductor auxiliary film; a semiconductor film; a gate insulating film; and a gate electrode. The first semiconductor auxiliary film is provided in a selective region on the substrate. The semiconductor film includes an oxide semiconductor material. The semiconductor film has a low-resistive region and a channel region. The low-resistive region abuts the first semiconductor auxiliary film. The channel region is provided in a portion different from the low-resistive region. The gate insulating film covers the semiconductor film from the channel region to at least part of the low-resistive region. The gate electrode faces the channel region of the semiconductor film via the gate insulating film.

A display unit according to one example embodiment of the technology includes: a display element; and a semiconductor device. The semiconductor device drives the display element. The semiconductor device includes a substrate, a first semiconductor auxiliary film, a semiconductor film, a gate insulating film, and a gate electrode. The first semiconductor auxiliary film is provided in a selective region on the substrate. The semiconductor film includes an oxide semiconductor material. The semiconductor film has a low-resistive region and a channel region. The low-resistive region abuts the first semiconductor auxiliary film. The channel region is provided in a portion different from the low-resistive region. The gate insulating film covers the semiconductor film from the channel region to at least part of the low-resistive region. The gate electrode faces the channel region of the semiconductor film via the gate insulating film.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
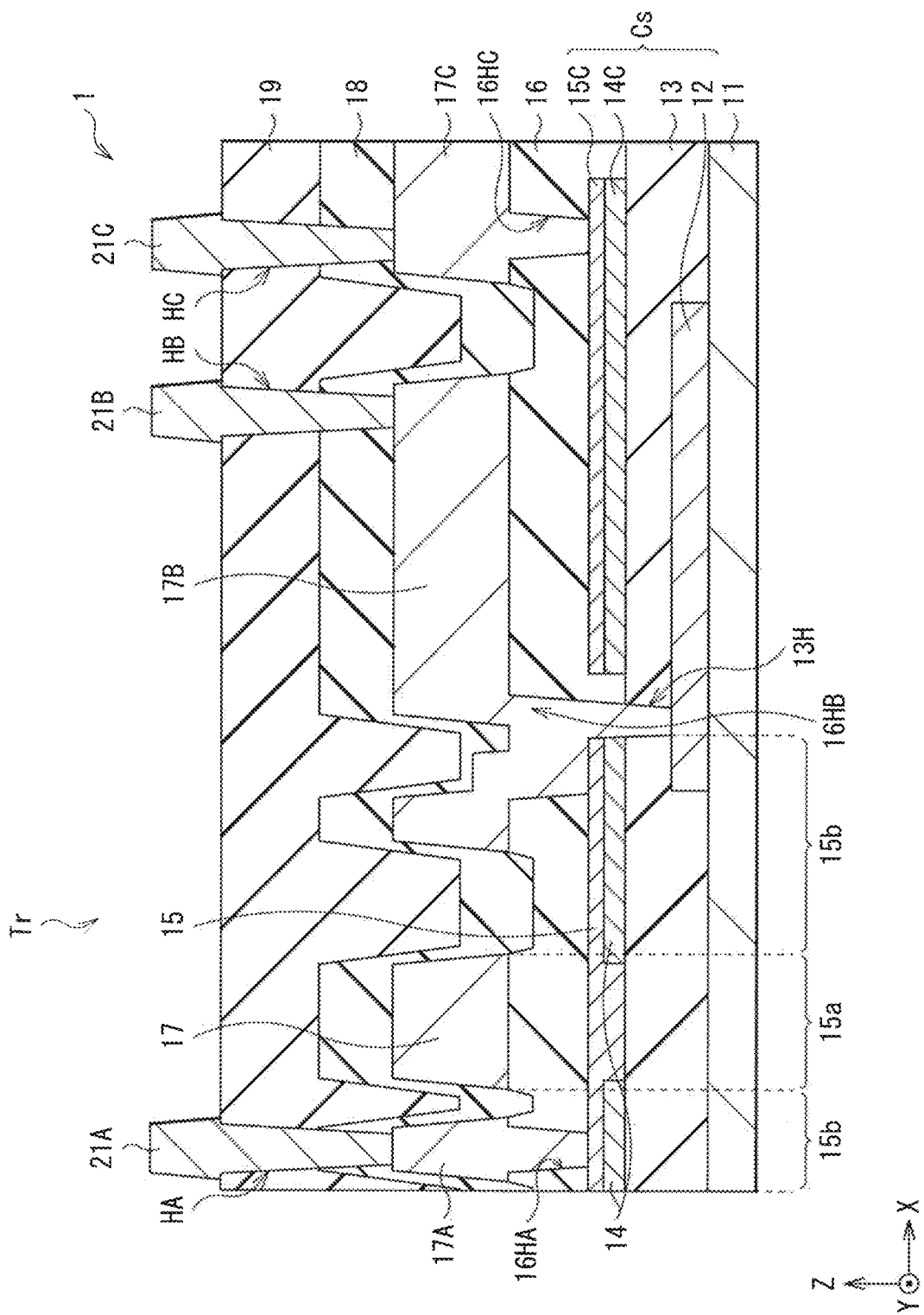
FIG. 1 is a schematic cross-sectional view illustrating an outline configuration of a semiconductor device according to one example embodiment of the technology.

In the following, some example embodiments of the technology are described in detail, in the following order, with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail.

Embodiments

[Configuration]

FIG. 1 schematically illustrates a cross-sectional configuration of a semiconductor device 1 according to one example embodiment of the technology. The semiconductor device 1 may be provided in a driving circuit for each of a display unit 2A in FIG. 7 and an imaging unit 2B in FIG. 8, for example. The semiconductor device 1 may include a top-gate type thin film transistor (hereinafter referred to as transistor Tr) and a storage capacitor (hereinafter referred to as storage capacitor Cs). The transistor Tr and the storage capacitor Cs may be electrically coupled to each other.

The transistor Tr may include a first insulating film 13, a semiconductor auxiliary film 14, a semiconductor film 15, a second insulating film 16, and a gate electrode 17 in order on a substrate 11. The semiconductor film 15, i.e., a low-resistive region 15b described below, may be electrically coupled to a source-drain electrode 21A via a coupling wiring line 17A. The semiconductor auxiliary films 14 may correspond to specific but non-limiting examples of first semiconductor auxiliary films according to one embodiment of the technology. The second insulating film 16 may correspond to a specific but non-limiting example of a gate insulating film according to one embodiment of the technology.

The storage capacitor Cs may include a first electrode 12, the first insulating film 13, a semiconductor auxiliary film 14C, and a second electrode 15C in order on the substrate 11. The semiconductor film 15 of the transistor Tr may be electrically coupled to the first electrode 12 of the storage capacitor Cs via a coupling wiring line 17B. The second insulating film 16 may be provided between the coupling wiring line 17B and the second electrode 15C. The second insulating film 16 may be provided with holes 16HA, 16HB, and 16HC passing through the second insulating film 16. The coupling wiring line 17A may cover the hole 16HA. The coupling wiring line 17B may cover the hole 16HB. A coupling wiring line 17C may cover the hole 16HC. The semiconductor auxiliary film 14C may correspond to a specific but non-limiting example of a second semiconductor auxiliary film according to one embodiment of the technology.

The semiconductor device 1 may be provided with a passivation film 18 and an interlayer insulating film 19. The passivation film 18 and the interlayer insulating film 19 may cover the gate electrode 17 and the coupling wiring lines 17A, 17B, and 17C. The interlayer insulating film 19 may cover the gate electrode 17 and the coupling wiring lines 17A, 17B, and 17C via the passivation film 18. The source-drain electrode 21A may be provided on the interlayer insulating film 19. The source-drain electrode 21A may be coupled to the coupling wiring line 17A via a contact hole HA passing through the interlayer insulating film 19 and the passivation film 18. The semiconductor device 1 may include wiring lines 21B and 21C in addition to the source-drain electrode 21A on the interlayer insulating film 19, for example. The wiring lines 21B and 21C may be respectively coupled to the coupling wiring lines 17B and 17C via contact holes HB and HC passing through the interlayer insulating film 19 and the passivation film 18.

The semiconductor film 15 may have a region facing the gate electrode 17. The region may serve as a channel region 15a of the transistor Tr. The low-resistive regions 15b may be provided adjacent to the channel region 15a. The low-resistive regions 15b may be lower in electric resistance than the channel region 15a.

The substrate 11 may include glass, quartz, or silicon, for example. Alternatively, the substrate 11 may include a resin material such as polyethylene terephthalate (PET), polyimide (PI), polycarbonate (PC), or polyethylene naphthalate (PEN). Instead of these materials, the substrate 11 may include a plate of a metal such as stainless steel (SUS) provided with an insulating material film.

An under coat (UC) film may be provided between the substrate 11 and the first electrode 12 and between the substrate 11 and the first insulating film 13. The UC film is not illustrated. The UC film may suppress or prevent sodium ions and other substances from migrating from the substrate 11 to an upper layer, for example. The UC film may include an insulating material such as a silicon nitride (SiN) film or a silicon oxide (SiO) film. For example, the UC film may be a multilayer film including a silicon nitride (SiN) film and a silicon oxide (SiO) film in order from the substrate 11.

[Storage Capacitor Cs]

The first electrode 12 may be provided in a selective region on the substrate 11. The first electrode 12 may have a portion that faces the second electrode 15C and a portion that does not face the second electrode 15C. In the first electrode 12, the portion that does not face the second electrode 15C may be provided closer to the transistor Tr than the second electrode 15C in an X axis direction in FIG. 1, and faces the hole 16HB. The first electrode 12 may include a metal such as molybdenum (Mo), tungsten (W), aluminum (Al), copper (Cu), silver (Ag), or titanium (Ti). Alternatively, the first electrode 12 may include a metal alloy or a multilayer film that includes a plurality of metal films. The first electrode 12 may include an electrically-conductive material other than a metal.

The first insulating film 13 may lie between the first electrode 12 and the semiconductor auxiliary film 14C. The first insulating film 13 may be provided with a hole 13H passing through the first insulating film 13 to reach the first electrode 12. The hole 13H may be provided at a position facing the hole 16HB. The coupling wiring line 17B may be coupled to the first electrode 12 via the hole 16HB and the hole 13H. The first insulating film 13 may be an inorganic insulating film such as a silicon oxide (SiOx) film, a silicon nitride (SiNx) film, a silicon oxide nitride (SiON) film, or an aluminum oxide (AlOx) film.

The second electrode 15C may be opposed to the first electrode 12 via the first insulating film 13 and the semiconductor auxiliary film 14C. The second electrode 15C may have a portion opposed to the first electrode 12 and a portion not opposed to the first electrode 12. In the second electrode 15C, the portion not opposed to the first electrode 12 may be provided to extend from the portion opposed to the first electrode 12 to a side opposite to the transistor Tr in the X axis direction in FIG. 1. As described below, the second electrode 15C may be formed in a single process together with the semiconductor film 15, for example. The second electrode 15C may be identical in material to the semiconductor film 15. The second electrode 15C may include an oxide semiconductor material, for example.

The semiconductor auxiliary film 14C provided between the first insulating film 13 and the second electrode 15C may be provided in a region overlaid with the second electrode 15C in a plan view, i.e., in an XY plane in FIG. 1. In other words, end faces of the semiconductor auxiliary film 14C may be disposed substantially aligned with end faces of the second electrode 15C in a plan view. The semiconductor auxiliary film 14C may be in contact with a lower face of the second electrode 15C. The lower face may be adjacent to the substrate 11. As described below, the semiconductor auxiliary film 14C may be formed in a single process together with the semiconductor auxiliary films 14, for example. The semiconductor auxiliary film 14C may be identical in material to the semiconductor auxiliary films 14.

The semiconductor auxiliary film 14C in contact with the second electrode 15C including an oxide semiconductor, for example, may reduce electric resistance of the second electrode 15C. That is, the semiconductor auxiliary film 14C may take a role of achieving the second electrode 15C having low resistance. In a specific but non-limiting example, the semiconductor auxiliary film 14C may have carrier donating properties with respect to an oxide semiconductor material, for example. The semiconductor auxiliary film 14C may thus supply carriers to the oxide semiconductor material. This makes it possible to improve electrical conductivity of the oxide semiconductor material and cause the second electrode 15C including the oxide semiconductor material to have low resistance. Alternatively, the semiconductor auxiliary film 14C may have electrical conductivity. This makes it possible to allow the semiconductor auxiliary film 14C itself and the second electrode 15C to serve as one of a pair of electrodes constituting the storage capacitor Cs.

The second insulating film 16 on the second electrode 15C may cover an upper face of the second electrode 15C and the end faces of the second electrode 15C and the semiconductor auxiliary film 14C. The second insulating film 16 may be provided with the hole 16HC passing through the second insulating film 16 to reach the second electrode 15C. For example, the coupling wiring line 17C may be provided to fill the hole 16HC, electrically coupling the coupling wiring line 17C to the second electrode 15C. The hole 16HB of the second insulating film 16 may be disposed at a position opposed to the first electrode 12. Part of a side wall of the hole 16HB may be substantially aligned with part of a side wall of the hole 13H of the first insulating film 13 in a plan view. The hole 16HB and the hole 13H may be in communication with each other. The coupling wiring line 17B filled in the hole 16HB and the hole 13H may be coupled to the first electrode 12.

[Transistor Tr]

Figure 2:
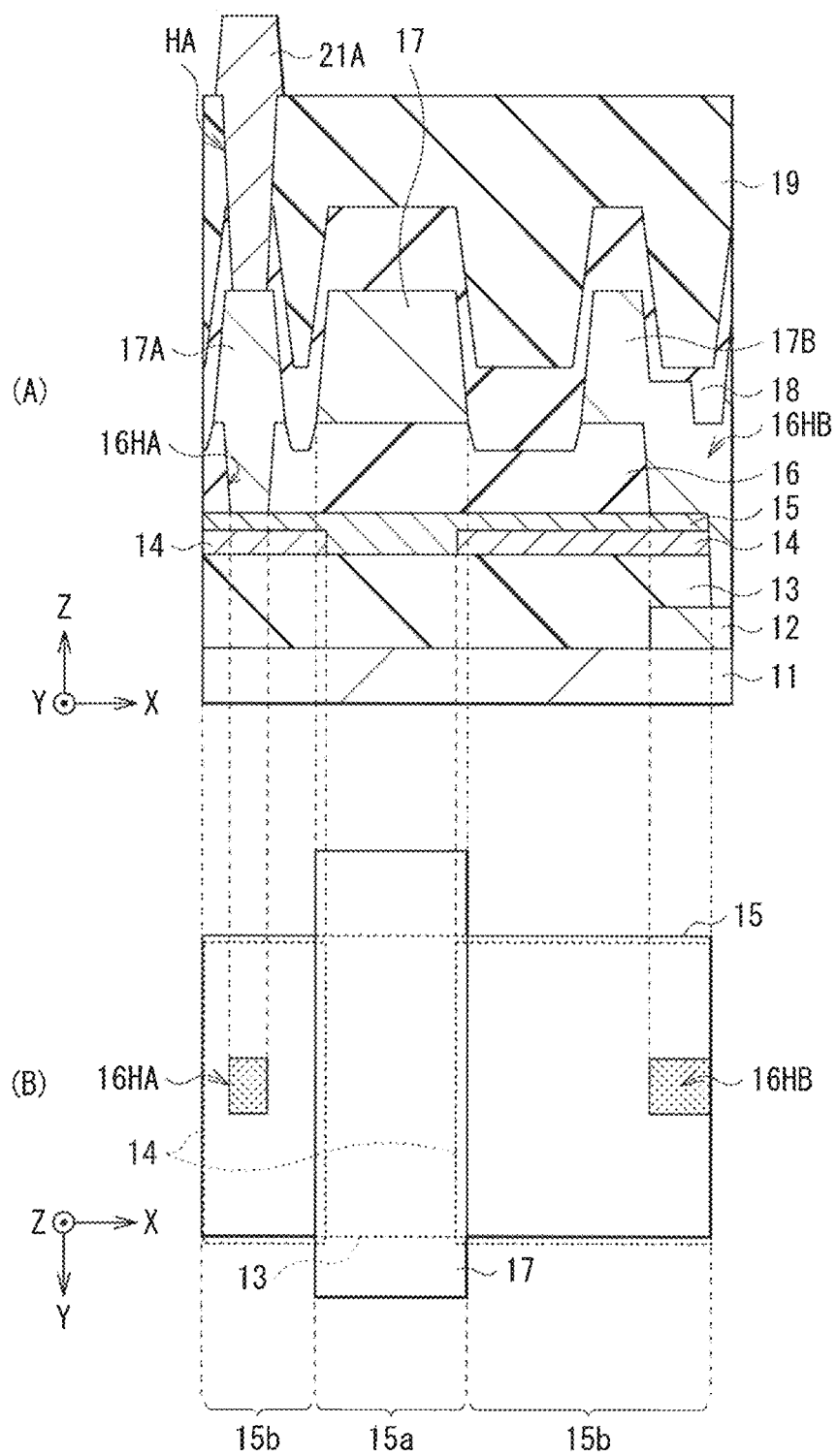
FIG. 2 is a schematic view of a transistor illustrated in FIG. 1, wherein Part (A) of FIG. 2 is a cross-sectional view of the transistor, and Part (B) of FIG. 2 is a plan view of the transistor.

FIG. 2 schematically illustrates a configuration of the transistor Tr. Part (A) of FIG. 2 illustrates a cross-sectional configuration of the transistor Tr. Part (B) of FIG. 2 illustrates a planar configuration of the transistor Tr.

The semiconductor film 15 may be provided in a selective region on the first insulating film 13. The semiconductor film 15 may include an oxide semiconductor including, as a main component, at least one element selected from among indium (In), gallium (Ga), zinc (Zn), tin (Sn), titanium (Ti), and niobium (Nb), for example. In a specific but non-limiting example, the semiconductor film 15 may include an indium-tin-zinc oxide (ITZO), an indium-gallium-zinc oxide (IGZO: InGaZnO), a zinc oxide (ZnO), an indium zinc oxide (IZO), an indium-gallium oxide (IGO), an indium tin oxide (ITO), or an indium oxide (InO), for example. The semiconductor film 15 may include another semiconductor material such as amorphous silicon, microcrystalline silicon, polycrystalline silicon, or organic semiconductor, for example. The semiconductor film 15 may have a thickness ranging from 10 nm to 300 nm, for example. In one example embodiment, the semiconductor film 15 may have a thickness of 60 nm or thinner. Reducing the thickness of the semiconductor film 15 makes it possible to reduce the absolute number of defects in the semiconductor, suppressing a negative shift of a threshold voltage. This therefore makes it possible to achieve excellent transistor characteristics with a higher on/off ratio. This further makes it possible to reduce a time required to form the semiconductor film 15, improving productivity.

The semiconductor film 15 may have a pair of the low-resistive regions 15b adjacent to respective opposite sides of the channel region 15a. One of the low-resistive regions 15b may be coupled to the source-drain electrode 21A via the coupling wiring line 17A. The other one of the low-resistive regions 15b may lie adjacent to the storage capacitor Cs. The other one of the low-resistive regions 15b may extend from a position adjacent to the channel region 15a to a position facing the hole 16HB provided in the second insulating film 16. The other one of the low-resistive regions 15b may be coupled to the first electrode 12 of the storage capacitor Cs via the coupling wiring line 17B.

The semiconductor auxiliary film 14 provided between the first insulating film 13 and the semiconductor film 15 may be provided in selective regions on the substrate 11. In a specific but non-limiting example, a pair of the semiconductor auxiliary films 14 may be provided in respective regions overlaid with the pair of low-resistive regions 15b of the semiconductor film 15 in a plan view. The pair of semiconductor auxiliary films 14 may be each in contact with a lower face of the semiconductor film 15. The semiconductor auxiliary films 14 may not be provided in a region overlaid with the channel region 15a of the semiconductor film 15 in a plan view. That is, the pair of semiconductor auxiliary films 14 may be selectively provided in contact with the low-resistive regions 15b, among the channel region 15a and the low-resistive regions 15b of the semiconductor film 15. Outside end faces of the pair of semiconductor auxiliary films 14 may be substantially aligned with end faces E15 of the semiconductor film 15 in a plan view. That is, the semiconductor auxiliary films 14 may be provided within the low-resistive regions 15b so as to be in contact with substantially the entire the lower face of the semiconductor film 15.

The pair of semiconductor auxiliary films 14 may be provided to form the pair of low-resistive regions 15b on the semiconductor film 15. In other words, the pair of semiconductor auxiliary films 14 may define the pair of low-resistive regions 15b of the semiconductor film 15. The semiconductor auxiliary films 14 in contact with the semiconductor film 15 may urge a current to flow via the low-resistive regions 15b.

For example, the semiconductor auxiliary films 14 selectively in contact with the low-resistive regions 15b of the semiconductor film 15 may reduce electric resistance of the low-resistive regions 15b. That is, the semiconductor auxiliary films 14 may take a role of achieving the low-resistive regions 15b having low resistance. In a specific but non-limiting example, the semiconductor auxiliary films 14 may have carrier donating properties with respect to the semiconductor film 15, for example. The semiconductor auxiliary films 14 may thus supply carriers to the low-resistive regions 15b. This makes it possible to improve electrical conductivity of the low-resistive regions 15b and achieve the low-resistive regions 15b having low resistance. The semiconductor auxiliary films 14 and 14C having the carrier donating properties as described above may include a metal such as aluminum (Al). In a specific but non-limiting example, the semiconductor auxiliary films 14 and 14C may include only aluminum (Al) or a metal alloy including aluminum. Non-limiting examples of the metal alloy including aluminum may include, for example, an aluminum silicon alloy (AlSi) and an aluminum copper alloy (AlCu).

Alternatively, the semiconductor auxiliary films 14 may have electrical conductivity. This makes it possible in the low-resistive regions 15b to allow the semiconductor auxiliary films 14 themselves to serve as electric conductors, allowing, together with the semiconductor film 15, a current to flow via the semiconductor auxiliary films 14. The semiconductor auxiliary films 14 and 14C having the electrical conductivity as described above may include a metal oxide including indium (In) or a metal oxide including zinc (Zn), for example. Non-limiting examples of the metal oxide including indium may include, for example, an indium tin oxide (ITO) and an indium zinc oxide (IZO). Non-limiting examples of the metal oxide including zinc may include, for example, a zinc oxide (ZnO) and an aluminum doped zinc oxide (AZO).

The semiconductor auxiliary films 14 and 14C may each have a thickness ranging from approximately 2 nm to approximately 300 nm, for example. By providing the semiconductor auxiliary films 14 having the carrier donating properties or electrical conductivity as described above, it is possible to urge a current to flow via the low-resistive regions 15b. Even if the semiconductor film 15 is etched excessively while a hole (e.g., the hole 16HA described below) is formed on the second insulating film 16, the semiconductor auxiliary films 14 being provided make it possible to suppress the low-resistive regions 15b from rising in electric resistance.

Figure 3A:
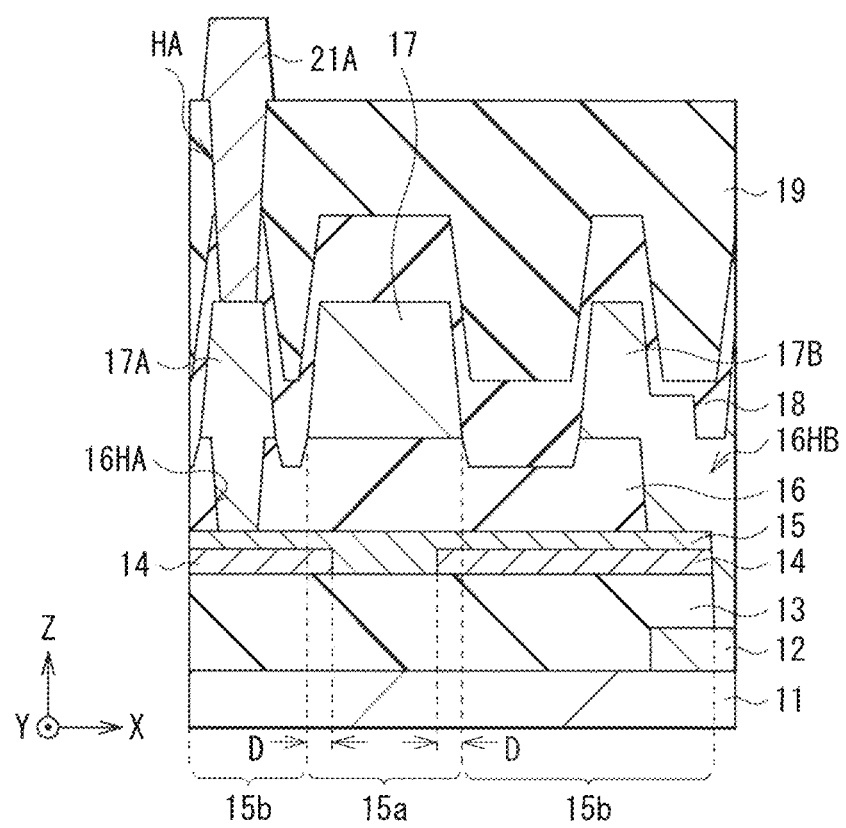
FIG. 3A is a cross-sectional view illustrating an example of a positional relationship between a semiconductor auxiliary film and a gate electrode illustrated in FIG. 2.
Figure 3B:
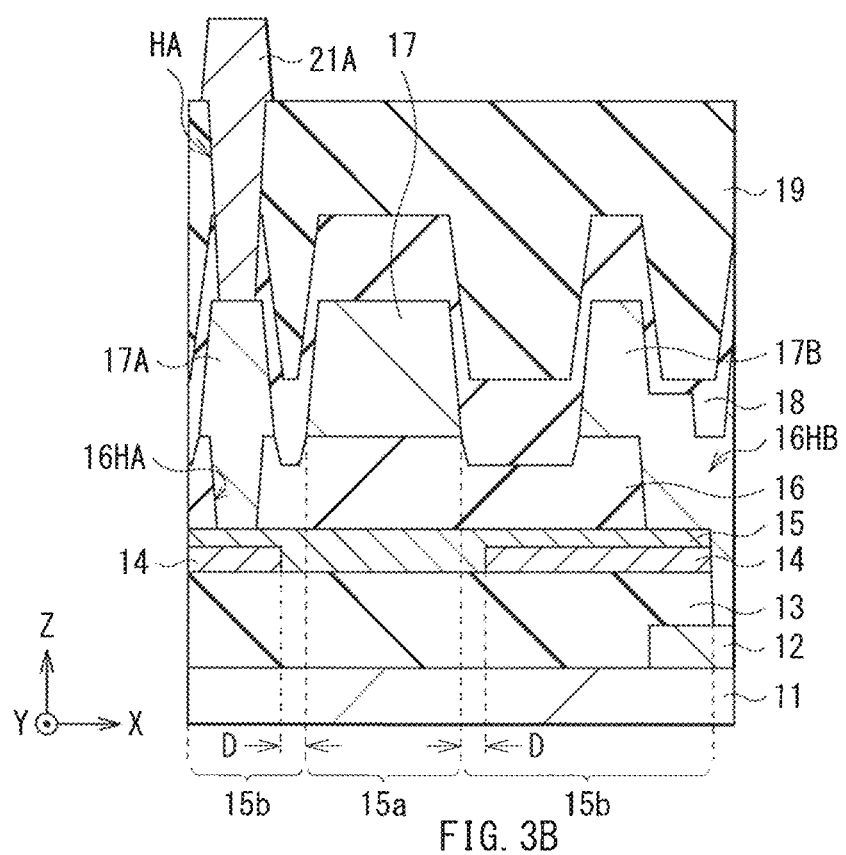
FIG. 3B is a cross-sectional view illustrating another example of the positional relationship between the semiconductor auxiliary film and the gate electrode illustrated in FIG. 3A.

FIGS. 3A and 3B illustrate examples of how inside end faces of the pair of semiconductor auxiliary films 14 are disposed. In the example illustrated in FIG. 3A, the inside end faces of the pair of semiconductor auxiliary films 14 may be disposed at positions opposed to the gate electrode 17. In the other example illustrated in FIG. 3B, the inside end faces of the pair of semiconductor auxiliary films 14 may be disposed at positions not opposed to the gate electrode 17. In one example embodiment, a distance D in a plan view in a channel length direction, i.e., an X axis direction in FIGS. 3A and 3B, from each of end faces of the gate electrode 17 to each of the inside end faces of the pair of semiconductor auxiliary films 14 may fall within a range from approximately 0.5 μm to approximately 3 μm. As a portion, opposed to the gate electrode 17, of each of the semiconductor auxiliary films 14 increases in area, as can be seen in FIG. 3A, a parasitic capacitance between the gate electrode 17 and each of the semiconductor auxiliary films 14 may increase. This may possibly sacrifice the transistor Tr in characteristics. As a portion, other than the channel region 15a, of the semiconductor film 15 not laminated with the semiconductor auxiliary films 14 increases in area, as can be seen in FIG. 3B, the low-resistive regions 15b may not be formed in a sufficient area on the semiconductor film 15. This may possibly result in a defect such as disconnection, for example.

The second insulating film 16 may be provided between the semiconductor film 15 and the gate electrode 17. The second insulating film 16 may serve as a gate insulating film of the transistor Tr. In the example embodiment, the second insulating film 16 may cover the semiconductor film 15 from the channel region 15a to at least part of each of the low-resistive regions 15b. On the channel region 15a and the low-resistive regions 15b of the semiconductor film 15, end faces of the second insulating film 16 may not therefore be formed around the gate electrode 17 opposed to the channel region 15a. In the example embodiment, the end faces of the second insulating film 16 may be end faces E116 in FIG. 6, described below. Although described in detail below, this makes it possible to suppress a short circuit from occurring between the semiconductor film 15 and the gate electrode 17 via an adhered material on one of the end faces of the second insulating film 16.

The second insulating film 16 may cover the semiconductor film 15, excluding the holes 16HA and 16HB, for example. In other words, the semiconductor film 15 may be covered by the second insulating film 16, excluding portions facing the holes 16HA and 16HB. For example, the second insulating film 16 may wholly covers the semiconductor film 15, excluding the holes 16HA and 16HB. Alternatively, the second insulating film 16 may cover the semiconductor film 15 from the channel region 15a to at least part of each of the low-resistive regions 15b, for example.

The hole 16HA may be provided at a position facing one of the low-resistive regions 15b to reach the semiconductor film 15. The hole 16HB may be provided at a position facing the other one of the low-resistive regions 15b to reach the semiconductor film 15. In other words, the holes 16HA and 16HB may be provided at the respective positions opposed to the semiconductor auxiliary films 14. The coupling wiring line 17A may be in contact with a region of the semiconductor film 15, i.e., a region of one of the low-resistive regions 15b. The region may serve as a bottom surface of the hole 16HA. The coupling wiring line 17A may be coupled to the one of the low-resistive regions 15b of the semiconductor film 15 via the hole 16HA of the second insulating film 16. The hole 16HA may correspond to a specific but non-limiting example of a hole according to one embodiment of the technology. The coupling wiring line 17B may be in contact with a region of the semiconductor film 15, i.e., a region of the other one of the low-resistive regions 15b. The region may serve as a bottom surface of the hole 16HB. The coupling wiring line 17B may be coupled to the other one of the low-resistive regions 15b of the semiconductor film 15 via the hole 16HB of the second insulating film 16.

For example, the second insulating film 16 may be a single-layer film including one of a silicon oxide film ($SiO_x$), a silicon nitride film ($SiN_x$), a silicon nitride oxide film (SiON), and an aluminum oxide film ($AlO_x$), or a multilayer film including two or more thereof.

The gate electrode 17 provided in a selective region on the second insulating film 16, i.e., a region facing the channel region 15a, may control carrier density in the channel region 15a with a gate voltage (Vg) applied thereto. The gate electrode 17 may as well serve as a wiring line for supplying potential. Non-limiting examples of the constituent material of the gate electrode 17 may include, for example, one of titanium (Ti), tungsten (W), tantalum (Ta), aluminum (Al), molybdenum (Mo), silver (Ag), neodymium (Nd), and copper (Cu), or a metal alloy thereof. Alternatively, the gate electrode 17 may include a compound including at least one of the elements described above or a multilayer film including two or more thereof. The gate electrode 17 may be a transparent electrically-conductive film including an indium tin oxide (ITO), for example.

The hole 16HA of the second insulating film 16 may be filled with the coupling wiring line 17A. The coupling wiring line 17A may electrically couple the source-drain electrode 21A on the interlayer insulating film 19 and the one of the low-resistive regions 15b of the semiconductor film 15.

The coupling wiring lines 17B and 17C provided on the second insulating film 16 may be electrically separated from each other. The coupling wiring line 17B may be provided to fill the hole 16HB and the hole 13H of the first insulating film 13 from above the second insulating film 16. The coupling wiring line 17B may electrically couple the other one of the low-resistive regions 15b of the semiconductor film 15 and the first electrode 12. The coupling wiring line 17B may further electrically couple the first electrode 12 and the wiring line 21B on the interlayer insulating film 19. The coupling wiring line 17C may be provided to fill the hole 16HC of the second insulating film 16 from above the second insulating film 16. The coupling wiring line 17C may electrically couple the wiring line 21C on the interlayer insulating film 19 and the second electrode 15C. As described below, the coupling wiring lines 17A, 17B, and 17C may be formed in a single process together with the gate electrode 17, for example. The coupling wiring lines 17A, 17B, and 17C may be identical in material to the gate electrode 17.

The passivation film 18 may be provided on an entire top surface of the substrate 11 to cover the gate electrode 17 and the coupling wiring lines 17A, 17B, and 17C, for example. The passivation film 18 may include a silicon oxide ($SiO_2$) film, for example. Alternatively, the passivation film 18 may include a silicon nitride (SiN) film or a silicon oxide nitride (SiON) film, for example.

The interlayer insulating film 19 may cover the gate electrode 17 and the coupling wiring lines 17A, 17B, and 17C via the passivation film 18. The interlayer insulating film 19 may be provided on the entire top surface of the substrate 11, for example. The contact hole HA may pass through the interlayer insulating film 19 and the passivation film 18 to reach the coupling wiring line 17A. The contact hole HA may be provided at a position opposed to the hole 16HA of the second insulating film 16, for example. The contact hole HB may pass through the interlayer insulating film 19 and the passivation film 18 to reach the coupling wiring line 17B. The contact hole HB may be provided at a position not opposed to the hole 13H of the first insulating film 13, for example. The contact hole HB may be provided at a position farther from the transistor Tr than the hole 13H of the first insulating film 13 is in a plan view. The contact hole HC may pass through the interlayer insulating film 19 and the passivation film 18 to reach the coupling wiring line 17C. The contact hole HC may be provided at a position opposed to the hole 16HC of the second insulating film 16, for example. The interlayer insulating film 19 may include a photosensitive resin film, for example. In a specific but non-limiting example, the interlayer insulating film 19 may include a polyimide resin film, for example. Alternatively, the interlayer insulating film 19 may include novolak resin or acrylic resin, for example.

The source-drain electrode 21A provided on the interlayer insulating film 19 may be coupled to the coupling wiring line 17A via the contact hole HA. The source-drain electrode 21A may serve as a source or a drain of the transistor Tr. For example, the source-drain electrode 21A may include a transparent electrically-conductive film or a metal described above as an example of the constituent material of the gate electrode 17. It is desirable that the source-drain electrode include a material having high electrical conductivity.

The source-drain electrode 21A and the wiring lines 21B and 21C may be provided on the interlayer insulating film 19. The wiring line 21B may be coupled to the coupling wiring line 17B via the contact hole HB. The wiring line 21C may be coupled to the coupling wiring line 17C via the contact hole HC. As described below, the wiring lines 21B and 21C may be formed in a single process together with the source-drain electrode 21A, for example. The wiring lines 21B and 21C may be identical in material to the source-drain electrode 21A.

[Manufacturing Method]

Described below with reference to FIGS. 4A to 4F, for example, is a method of manufacturing the semiconductor device 1 described above.

Figure 4A:
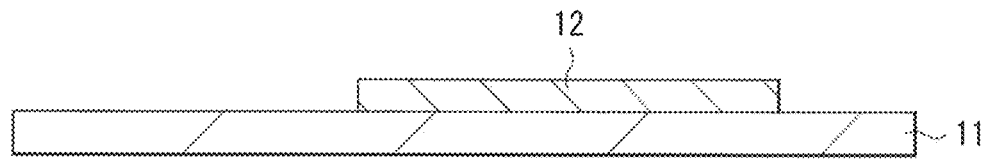
FIG. 4A is a schematic cross-sectional view illustrating a process of manufacturing the semiconductor device illustrated in FIG. 1.

As illustrated in FIG. 4A, the first electrode 12 may first be formed on the substrate 11. After an electrically-conductive metal film is formed on the entire top surface of the substrate 11, for example, the metal film may be dry-etched to pattern and form the first electrode 12 into a predetermined shape.

Figure 4B:
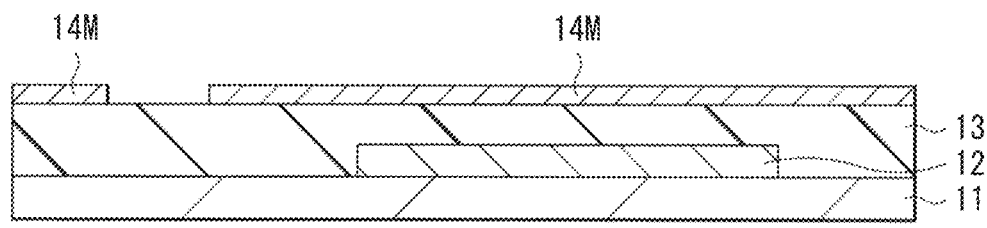
FIG. 4B is a schematic cross-sectional view illustrating a process subsequent from FIG. 4A.

As illustrated in FIG. 4B, the first insulating film 13 and a semiconductor auxiliary material film 14M may then be formed in order on the first electrode 12. With the semiconductor auxiliary material film 14M, it is possible to form the semiconductor auxiliary films 14 and 14C in later processes. The first insulating film 13 may be formed on the entire top surface of the substrate 11 to cover the first electrode 12. For example, sputtering may be used to form a film of IZO on the first insulating film 13 to form the semiconductor auxiliary material film 14M. At this time, for example, photolithography and wet-etching may be used to remove a portion of the semiconductor auxiliary material film 14M to face the channel region 15a of the semiconductor film 15 in later processes.

Figure 4C:
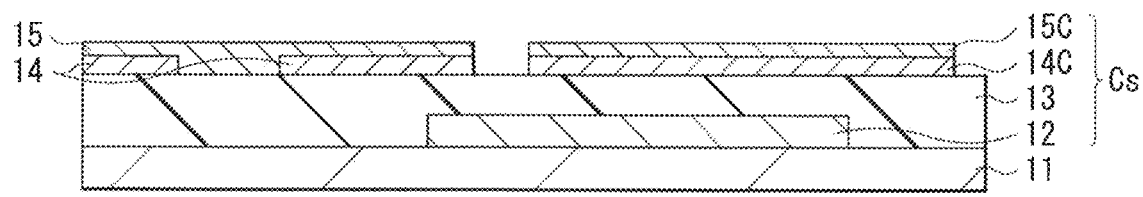
FIG. 4C is a schematic cross-sectional view illustrating a process subsequent from FIG. 4B.

After the semiconductor auxiliary material film 14M is formed, the semiconductor film 15 and the second electrode 15C may be formed, as illustrated in FIG. 4C. For example, after sputtering is used to form a film of an oxide semiconductor material on the semiconductor auxiliary material film 14M, photolithography and wet-etching may be used to pattern and form the semiconductor film 15 and the second electrode 15C into predetermined shapes. In succession with the patterning of the oxide semiconductor material, the semiconductor auxiliary material film 14M may be patterned. This makes it possible to form the pair of semiconductor auxiliary films 14 immediately below the semiconductor film 15 and the semiconductor auxiliary film 14C immediately below the second electrode 15C. With the pair of semiconductor auxiliary films 14, the pair of low-resistive regions 15b may be formed on the semiconductor film 15.

Figure 4D:
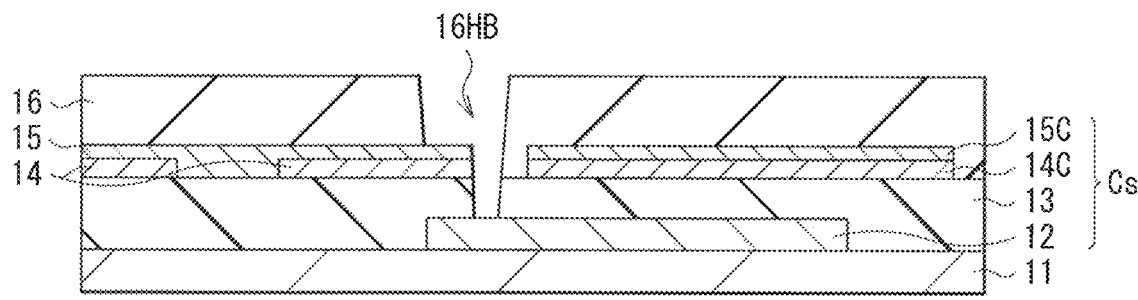
FIG. 4D is a schematic cross-sectional view illustrating a process subsequent from FIG. 4C.

As illustrated in FIG. 4D, the second insulating film 16 may then be formed on the entire top surface of the substrate 11 to cover the semiconductor film 15 and the second electrode 15C. For example, chemical vapor deposition (CVD) may be used to form an insulating film of a silicon oxide (SiO) on the entire top surface of the substrate 11 to form the second insulating film 16. After that, photolithography and dry-etching may be used to form the hole 16HB on the insulating film. This makes it possible to form, together with the hole 16HB, the hole 13H on the first insulating film 13 at a position that faces the hole 16HB. After the hole 16HB is formed, the holes 16HA and 16HC may be formed on the second insulating film 16.

Figure 4E:
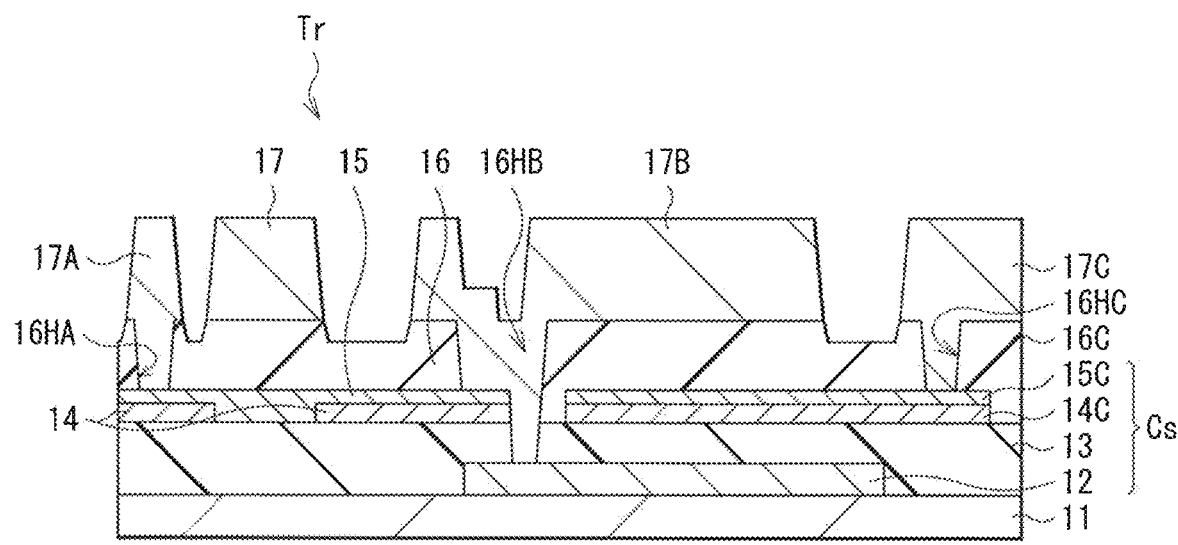
FIG. 4E is a schematic cross-sectional view illustrating a process subsequent from FIG. 4D.

As illustrated in FIG. 4E, the gate electrode 17 and the coupling wiring lines 17A, 17B, and 17C may then be formed on the second insulating film 16. The gate electrode 17 and the coupling wiring lines 17A, 17B, and 17C may be formed as described below, for example. A film of an electrically-conductive metal material may be first formed on the entire top surface of the substrate 11 to cover the second insulating film 16. Photolithography and dry-etching may then be used to pattern the metal film into a predetermined shape. This makes it possible to form the gate electrode 17 in a region not opposed to the pair of semiconductor auxiliary films 14, the coupling wiring line 17A filling the hole 16HA, the coupling wiring line 17B filling the hole 16HB, and the coupling wiring line 17C filling the hole 16HC.

Figure 4F:
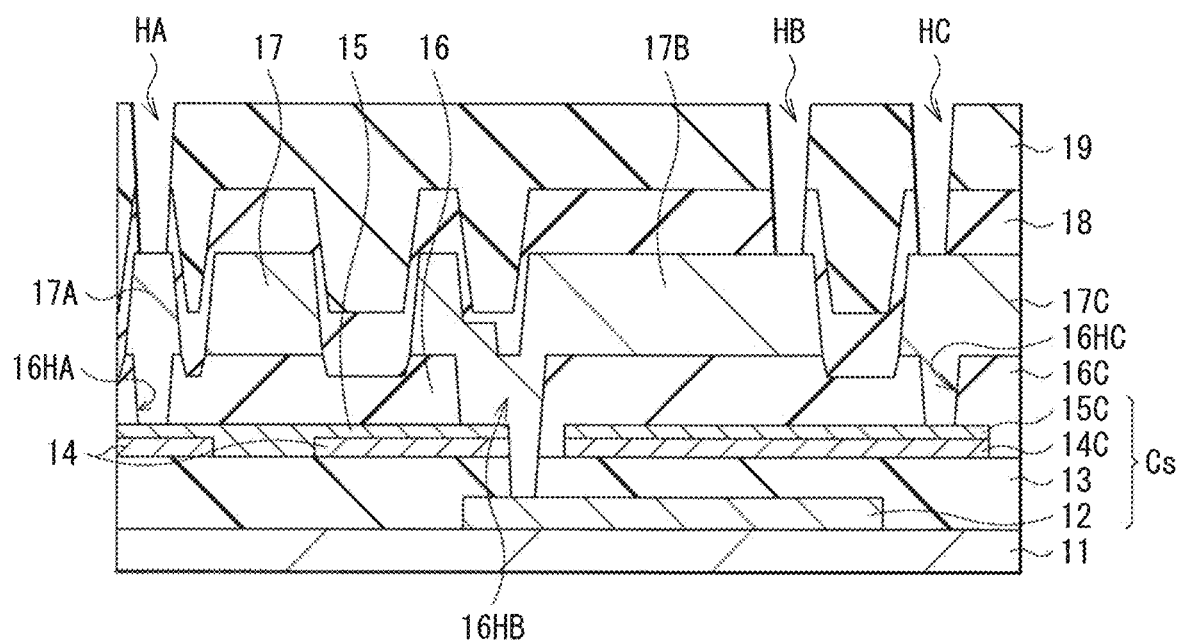
FIG. 4F is a schematic cross-sectional view illustrating a process subsequent from FIG. 4E.

After that, as illustrated in FIG. 4F, the passivation film 18 and the interlayer insulating film 19 may be formed on the entire top surface of the substrate 11. The contact holes HA, HB, and HC may be formed in the passivation film 18 and the interlayer insulating film 19. Finally, the source-drain electrode 21A and the wiring lines 21B and 21C may be formed on the interlayer insulating film 19. The semiconductor device 1 illustrated in FIG. 1 may be thus completed.

[Workings and Effects]

Upon application of an on-voltage equal to or higher than a threshold voltage onto the gate electrode 17 in the semiconductor device 1 according to the example embodiment, the channel region 15a of the semiconductor film 15 is activated. This causes a current to flow between the pair of low-resistive regions 15b. The current accordingly flows from the semiconductor film 15 to the first electrode 12 via the coupling wiring line 17B, and the storage capacitor Cs holds charge.

In the semiconductor device 1 according to the example embodiment, the second insulating film 16 covers the semiconductor film 15 from the channel region 15a to positions adjacent to ends of the pair of low-resistive regions 15b. This makes it possible to suppress a short circuit from occurring between the gate electrode 17 and the semiconductor film 15 via an adhered material on one of the end faces of the second insulating film 16. The workings and effects will now be described herein with reference to a comparative example.

Figure 5:
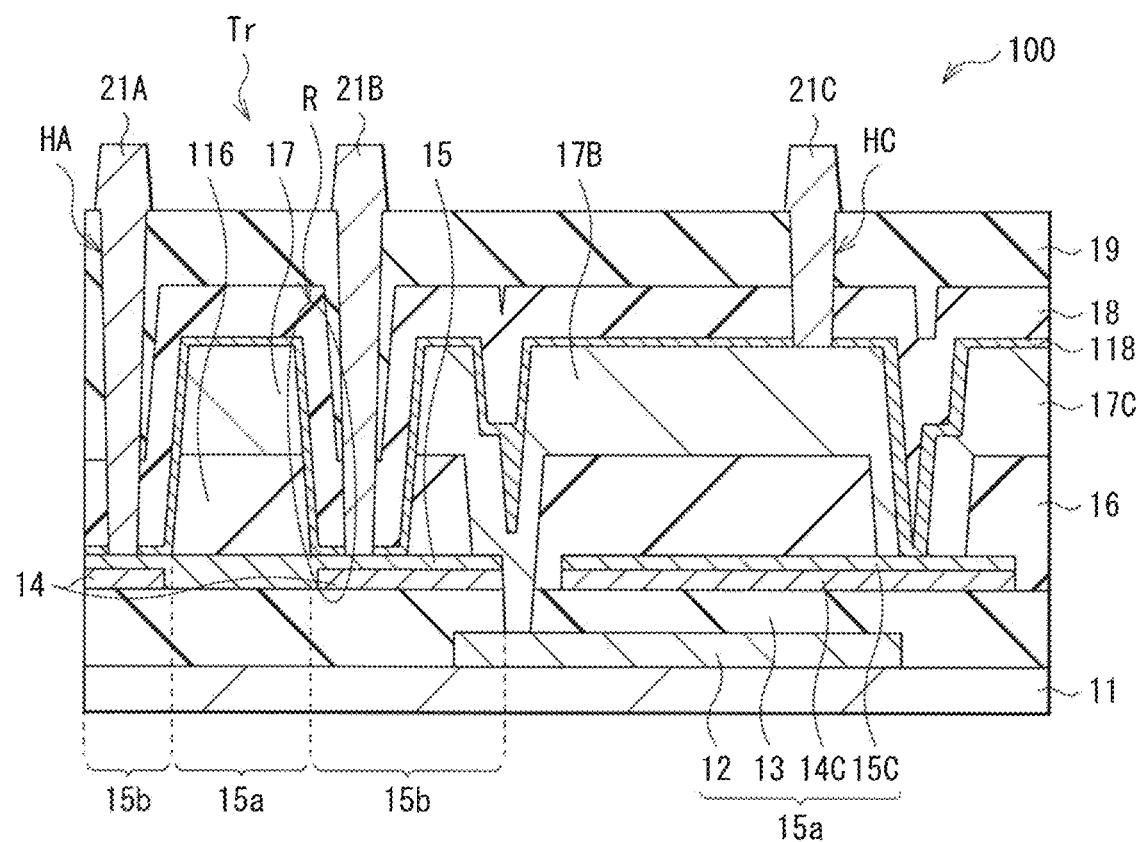
FIG. 5 is a schematic cross-sectional view illustrating an outline configuration of a semiconductor device according to a comparative example.

FIG. 5 schematically illustrates a cross-sectional configuration of a main part of a semiconductor device 100 according to the comparative example. The semiconductor device 100 may include a transistor Tr having a known self-aligned structure. In a specific but non-limiting example, a gate insulating film 116 may have a planar shape substantially identical to a planar shape of a gate electrode 17. End faces (i.e., end faces E116 in FIG. 6 described below) of the gate insulating film 116 may be substantially aligned with end faces of the gate electrode 17 in a plan view. That is, the gate insulating film 116 may cover only a channel region 15a on a semiconductor film 15.

The semiconductor device 100 may include a metal oxide film 118 in contact with low-resistive regions 15b of the semiconductor film 15. The metal oxide film 118 may include an aluminum oxide (AlO), for example. The metal oxide film 118 may take a role of drawing oxygen from the semiconductor film 15 to achieve the semiconductor film 15 having low resistance. Even if misalignment may occur between a pair of semiconductor auxiliary films 14 and the gate electrode 17 in the semiconductor device 100, it is possible for the metal oxide film 118 to form the low-resistive regions 15b at positions adjacent to the channel region 15a of the semiconductor film 15.

On the other hand, a short circuit can occur between the gate electrode 17 and the semiconductor film 15 in the semiconductor device 100 due to an adhered material (e.g., an adhered material 115 in FIG. 6 described below) on one of the end faces of the gate insulating film 116.

Figure 6:
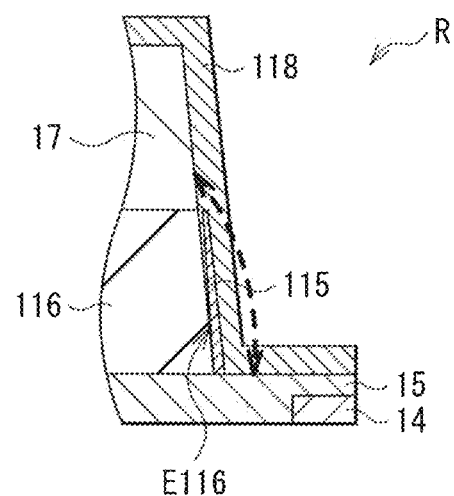
FIG. 6 is a schematic cross-sectional view of the semiconductor device illustrated in FIG. 5 for illustrating the configuration thereof in an enlarged manner.

FIG. 6 is an enlarged view of a portion R illustrated in FIG. 5. After the gate electrode 17 is formed, an insulating film may be patterned in accordance with a shape of the gate electrode 17 to form the gate insulating film 116. Due to excessive dry-etching during the patterning of the insulating film, the semiconductor film 15 may be reverse-sputtered, resulting in the adhered material 115, due to the semiconductor film 15, on one of the end faces E116 of the gate insulating film 116. The adhered material 115 can lower the gate electrode 17 and the semiconductor film 15 in pressure resistance, leading to a short circuit between the gate electrode 17 and the semiconductor film 15. The short circuit can easily lead to a defect in the semiconductor device 100.

In the semiconductor device 1, in contrast, the second insulating film 16 covers the channel region 15a and the pair of low-resistive regions 15b of the semiconductor film 15. Accordingly, the end faces of the second insulating film 16 is provided at positions away from the gate electrode 17 in the channel length direction. This therefore makes it possible to suppress a short circuit from occurring between the gate electrode 17 and the semiconductor film 15 via an adhered material, such as the adhered material 115 in FIG. 6, on one of the end faces of the second insulating film 16.

In the semiconductor device 1, a process of patterning the second insulating film 16 in accordance with the shape of the gate electrode 17 is not required, making it possible to reduce a tact time, compared with the semiconductor device 100.

In the semiconductor device 1, the pair of low-resistive regions 15b of the semiconductor film 15 is formed by the pair of semiconductor auxiliary films 14. This eliminates the need for a metal oxide film, such as the metal oxide film 118 of the semiconductor device 100, and thus reduces a cost compared with the semiconductor device 100.

With the second insulating film 16 covering the semiconductor film 15 from the channel region 15a to at least part of each of the low-resistive regions 15b in the example embodiment of the technology described above, it is possible to suppress a short circuit from occurring between the gate electrode 17 and the semiconductor film 15 via an adhered material on one of the end faces of the second insulating film 16. This therefore makes it possible to suppress a defect from occurring due to a short circuit being occurred.

Application Example 1

The semiconductor device 1 described in the example embodiment may be used in a driving circuit for each of a display unit (e.g., the display unit 2A in FIG. 7 described below), and an imaging unit (e.g., the imaging unit 2B in FIG. 8 described below), for example.

Figure 7:
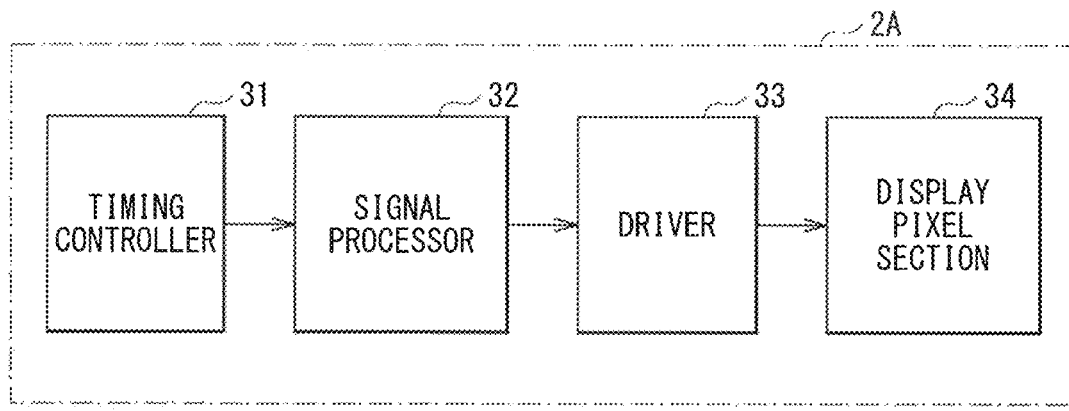
FIG. 7 is a block diagram illustrating an example configuration of a display unit to which the semiconductor device illustrated in FIG. 1 and other drawings is applied.

FIG. 7 illustrates an example block configuration of the display unit 2A. The display unit 2A may use an image signal received externally or generated internally to display an image. For example, the display unit 2A may be applied to a liquid crystal display as well as an organic electroluminescent (EL) display. The display unit 2A may include, for example, a timing controller 31, a signal processor 32, a driver 33, and a display pixel section 34.

The timing controller 31 may include a timing generator that generates various timing signals or control signals, and control driving of the signal processor 32 on the basis of the timing signals or control signals, for example. The signal processor 32 may perform a predetermined correction on a digital image signal received externally, and output the corrected image signal to the driver 33. The driver 33 may include a scanning-line driving circuit and a signal-line driving circuit, for example. The driver 33 may drive pixels in the display pixel section 34 through respective control lines. The display pixel section 34 may include display elements, such as organic EL elements or liquid crystal display elements, and a pixel circuit that drives the display elements per pixel, for example. The semiconductor device 1 according to the example embodiment of the technology may be applied to various circuits constituting part of the driver 33 or the display pixel section 34, for example.

Figure 8:
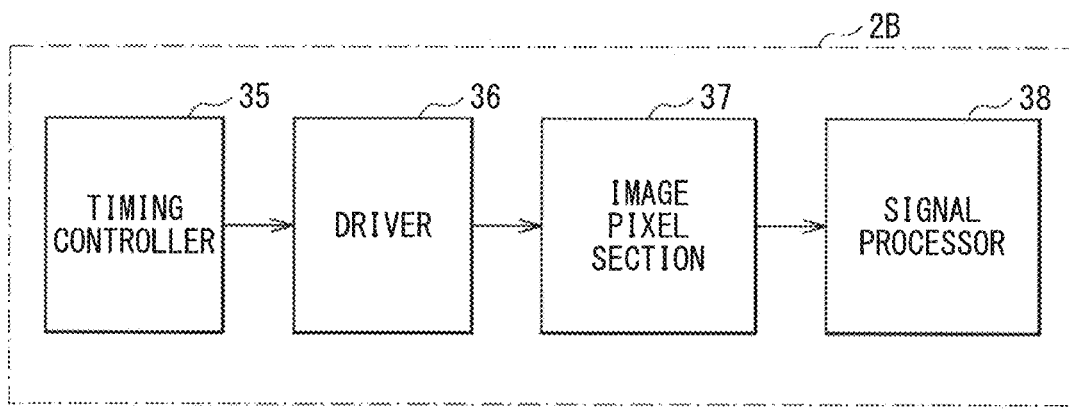
FIG. 8 is a block diagram illustrating an example configuration of an imaging unit to which the semiconductor device illustrated in FIG. 1 and other drawings is applied.

FIG. 8 illustrates an example block configuration of the imaging unit 2B. The imaging unit 2B may be a solid-state imaging unit that acquires electric signals as an image, for example. The imaging unit 2B may include a charge-coupled device (CCD) or a complementary metal oxide semiconductor (CMOS) image sensor. The imaging unit 2B may include a timing controller 35, a driver 36, an image pixel section 37, and a signal processor 38.

The timing controller 35 may include a timing generator that generates various timing signals or control signals, and control driving of the driver 36 on the basis of the timing signals or control signals, for example. The driver 36 may include a row-selection circuit, an analog-digital (AD) conversion circuit, and a horizontal transfer scanning circuit, for example. The driver 36 may read a signal from any pixel in the image pixel section 37 through corresponding one of control lines. The image pixel section 37 may include imaging elements or photoelectric conversion elements, such as photodiodes, and a pixel circuit to read signals, for example. The signal processor 38 may perform various signal processing on the signal received from the image pixel section 37. The semiconductor device 1 according to the example embodiment of the technology may be applied to various circuits constituting part of the driver 36 or the image pixel section 37, for example.

[Example of Electronic Apparatus]

Figure 9:
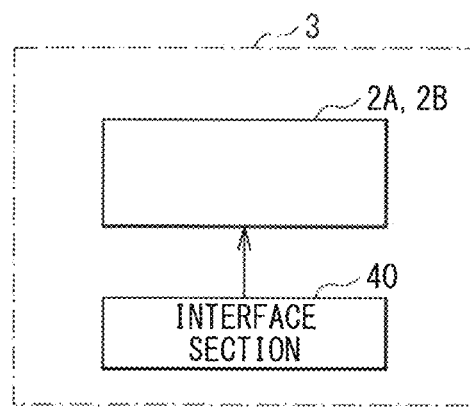
FIG. 9 is a block diagram illustrating an example configuration of an electronic apparatus according to one example embodiment of the technology.

The display unit 2A or the imaging unit 2B according to example embodiments of the technology may be applied to a variety of electronic apparatuses. FIG. 9 illustrates an example block configuration of an electronic apparatus 3. Specific but non-limiting examples of the electronic apparatus 3 may include television sets, personal computers (PCs), smartphones, tablet PCs, mobile phones, digital still cameras, and digital video cameras.

The electronic apparatus 3 may include, for example, the display unit 2A or the imaging unit 2B according to the example embodiments of the technology, and an interface section 40. The interface section 40 may be an input section that receives various external signals and external electric power. For example, the interface section 40 may include a user interface such as a touch panel, a keyboard, or operation buttons.

Although the technology has been described with reference to the example embodiments, the technology is not limited thereto, but may be modified in a wide variety of ways. For example, factors such as a material and a thickness of each layer exemplified in any foregoing example embodiments, etc. are illustrative and non-limiting examples. Any other material and any other thickness may be adopted besides those described above.

In the example embodiments, the semiconductor auxiliary films 14 and 14C may be in contact with the lower faces of the semiconductor film 15 and the second electrode 15C. However, the semiconductor auxiliary films 14 and 14C may be in contact with the upper faces of the semiconductor film 15 and the second electrode 15C.

In the example embodiments, the semiconductor device 1 includes the transistor Tr and the storage capacitor Cs. However, the semiconductor device 1 may include at least the transistor Tr.

It should be appreciated that the effects described herein are mere examples. Effects of the example embodiments of the technology are not limited to those described herein. The technology may further include any effect other than those described herein.

Furthermore, the technology encompasses any possible combination of some or all of the various embodiments and the modifications described herein and incorporated herein.

It is possible to achieve at least the following configurations from the above-described example embodiments of the technology.

(1) A semiconductor device includes:
a substrate;
a first semiconductor auxiliary film provided in a selective region on the substrate;
a semiconductor film including an oxide semiconductor material, the semiconductor film having a low-resistive region in contact with the first semiconductor auxiliary film and a channel region provided in a portion different from the low-resistive region;
a gate insulating film covering the semiconductor film from the channel region to at least part of the low-resistive region; and
a gate electrode opposed to the channel region of the semiconductor film via the gate insulating film.

(2) The semiconductor device according to (1), in which the first semiconductor auxiliary film urges a current to flow via the low-resistive region of the semiconductor film.

(3) The semiconductor device according to (1) or (2), further includes:
a hole provided at a position facing the low-resistive region of the semiconductor film, and that passes through the gate insulating film; and
a source-drain electrode electrically coupled to the low-resistive region of the semiconductor film via the hole.

(4) The semiconductor device according to (3), in which the first semiconductor auxiliary film, the semiconductor film, the gate insulating film, the gate electrode, and the source-drain electrode are provided in order on the substrate.

(5) The semiconductor device according to any one of (1) to (4), in which the first semiconductor auxiliary film includes a metal.

(6) The semiconductor device according to any one of (1) to (5), in which the first semiconductor auxiliary film includes aluminum.

(7) The semiconductor device according to any one of (1) to (4), in which the first semiconductor auxiliary film includes a metal oxide.

(8) The semiconductor device according to any one of (1) to (4), in which the first semiconductor auxiliary film includes an indium tin oxide or an indium zinc oxide.

(9) The semiconductor device according to any one of (1) to (8), further includes
a first electrode provided on the substrate, the first electrode being electrically coupled to the low-resistive region of the semiconductor film;
a second electrode including the oxide semiconductor material, the second electrode being provided opposed to at least part of the first electrode; and
a second semiconductor auxiliary film including a material identical to a constituent material of the first semiconductor auxiliary film, the second semiconductor auxiliary film being in contact with the second electrode.

(10) The semiconductor device according to (9), in which the first electrode, the second semiconductor auxiliary film, and the second electrode are provided in order on the substrate.

(11) A display unit including a display element and a semiconductor device that drives the display element, the semiconductor device including:

a substrate;

a first semiconductor auxiliary film provided in a selective region on the substrate;

a semiconductor film including an oxide semiconductor material, the semiconductor film having a low-resistive region in contact with the first semiconductor auxiliary film and a channel region provided in a portion different from the low-resistive region;

a gate insulating film covering the semiconductor film from the channel region to at least part of the low-resistive region; and a gate electrode opposed to the channel region of the semiconductor film via the gate insulating film.

In the semiconductor device and the display unit according to the example embodiments of the technology, the gate insulating film covers the semiconductor film from the channel region to at least part of the low-resistive region. This makes it possible to prevent end faces of the gate insulating film from being formed around the gate electrode provided at positions facing the channel region of the semiconductor film.

In the semiconductor device and the display unit according to the example embodiments of the technology, the gate insulating film covers the semiconductor film from the channel region to at least part of the low-resistive region, making it possible to suppress a short circuit from occurring between the gate electrode and the semiconductor film via an adhered material on one of the end faces of the gate insulating film. This therefore makes it possible to suppress a defect from occurring due to a short circuit being occurred. Note that the effects of the technology are not limited to those described above, and may be any effect described herein.

Although the technology has been described in terms of example embodiments and modification examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a substrate;
   a first auxiliary film in a selective region on the substrate;
   a semiconductor film including an oxide semiconductor material, the semiconductor film having a low-resistive region in contact with the first auxiliary film and a channel region in a portion different from the low-resistive region;
   a gate insulating film on the semiconductor film from the channel region to at least part of the low-resistive region, wherein the first auxiliary film is in contact with a face of the low-resistive region of the semiconductor film closest to the substrate;
   a gate electrode opposed to the channel region of the semiconductor film via the gate insulating film;
   a first electrode on the substrate, the first electrode being electrically coupled to the low-resistive region of the semiconductor film;
   a second electrode including the oxide semiconductor material, the second electrode being opposed to at least part of the first electrode; and
   a second auxiliary film including a material identical to a constituent material of the first auxiliary film, the second auxiliary film being in contact with the second electrode, wherein the first electrode, the second auxiliary film, and the second electrode are in order on the substrate.

2. The semiconductor device according to claim 1, wherein the first auxiliary film urges a current to flow via the low-resistive region of the semiconductor film.

3. The semiconductor device according to claim 1, further comprising:
   a hole at a position facing the low-resistive region of the semiconductor film, the hole passing through the gate insulating film; and
   a source-drain electrode electrically coupled to the low-resistive region of the semiconductor film via the hole.

4. The semiconductor device according to claim 3, wherein the first auxiliary film, the semiconductor film, the gate insulating film, the gate electrode, and the source-drain electrode are provided in order on the substrate.

5. The semiconductor device according to claim 1, wherein the first auxiliary film includes a metal.

6. The semiconductor device according to claim 1, wherein the first auxiliary film includes aluminum.

7. The semiconductor device according to claim 1, wherein the first auxiliary film includes a metal oxide.

8. The semiconductor device according to claim 1, wherein the first auxiliary film includes an indium tin oxide or an indium zinc oxide.

* * * * *